United States Patent
Ma et al.

(10) Patent No.: US 11,791,827 B2
(45) Date of Patent: Oct. 17, 2023

(54) PHASE INTERPOLATION CIRCUIT WITH HIGH LINEARITY

(71) Applicant: WUXI ESIONTECH CO., LTD., Wuxi (CN)

(72) Inventors: Xikun Ma, Wuxi (CN); Yizheng Xie, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 186 days.

(21) Appl. No.: 17/643,840

(22) Filed: Dec. 13, 2021

(65) Prior Publication Data

US 2022/0103182 A1 Mar. 31, 2022

Related U.S. Application Data

(63) Continuation of application No. PCT/CN2021/128288, filed on Nov. 3, 2021.

(30) Foreign Application Priority Data

Apr. 6, 2021 (CN) .......................... 202110366687.0

(51) Int. Cl.
*H03L 7/08* (2006.01)
*H03L 7/081* (2006.01)

(52) U.S. Cl.
CPC .................................. *H03L 7/0814* (2013.01)

(58) Field of Classification Search
CPC ......... H03L 7/0814; H03L 7/08; H03L 7/087; H03L 7/0998; H04L 27/2272
USPC ........ 375/215, 299–233, 327, 371, 373, 377
See application file for complete search history.

(56) References Cited

U.S. PATENT DOCUMENTS

| | | | | |
|---|---|---|---|---|
| 5,296,865 A | * | 3/1994 | Lewis | G01S 7/2813 342/384 |
| 5,917,762 A | * | 6/1999 | Zheng | H03K 5/135 365/194 |
| 6,484,268 B2 | * | 11/2002 | Tamura | G11C 7/222 713/400 |

(Continued)

FOREIGN PATENT DOCUMENTS

| CN | 106027037 A | 10/2016 |
|---|---|---|
| CN | 106100615 A | 11/2016 |

(Continued)

*Primary Examiner* — Emmanuel Bayard
(74) *Attorney, Agent, or Firm* — Bayramoglu Law Offices LLC

(57) ABSTRACT

A phase interpolation circuit with a high linearity includes a first parallel circuit constituted by M phase interpolation units, and a second parallel circuit constituted by N phase interpolation units. An input terminal of the first parallel circuit is connected to a first clock input terminal and grounded via a first capacitor. An input terminal of the second parallel circuit is connected to a second clock input terminal and grounded via a second capacitor. An output terminal of the first parallel circuit and an output terminal of the second parallel circuit are connected to a clock output terminal and grounded via a zeroth capacitor. A circuit parameter of each phase interpolation unit corresponds to a target output weight respectively. The target output weight of each phase interpolation unit is determined by iteration to minimize a phase difference between all output clock signals of the phase interpolation circuit.

10 Claims, 5 Drawing Sheets

(56) References Cited

U.S. PATENT DOCUMENTS

| | | | | |
|---|---|---|---|---|
| 6,650,159 B2* | 11/2003 | Wang | ............... | G06F 11/2221 |
| | | | | 327/272 |
| 11,368,143 B1* | 6/2022 | Chakraborty | ............ | H03K 5/01 |
| 2001/0030566 A1* | 10/2001 | Sahu | ............... | H03L 7/0814 |
| | | | | 327/276 |
| 2004/0169539 A1* | 9/2004 | Gauthier | ............... | H03L 7/0814 |
| | | | | 327/231 |
| 2010/0079180 A1* | 4/2010 | Kim | ............... | H03L 7/0818 |
| | | | | 327/158 |
| 2010/0164571 A1* | 7/2010 | Jang | ............... | H03K 5/13 |
| | | | | 327/158 |
| 2011/0068827 A1* | 3/2011 | Ali | ............... | H03D 13/00 |
| | | | | 327/3 |
| 2012/0086486 A1* | 4/2012 | Na | ............... | H03H 11/16 |
| | | | | 327/158 |
| 2015/0326229 A1* | 11/2015 | Boecker | ............... | H04L 7/0337 |
| | | | | 327/158 |
| 2019/0356306 A1* | 11/2019 | Palaskas | ............... | H03M 1/00 |
| 2020/0007131 A1* | 1/2020 | Tajalli | ............... | H03L 7/0995 |
| 2021/0305975 A1* | 9/2021 | Lu | ............... | H03K 5/135 |

FOREIGN PATENT DOCUMENTS

| | | |
|---|---|---|
| CN | 106656116 A | 5/2017 |
| CN | 110995212 A | 4/2020 |
| CN | 112165315 A | 1/2021 |
| CN | 113098453 A | 7/2021 |

\* cited by examiner

PHASE INTERPOLATION CIRCUIT WITH HIGH LINEARITY

CROSS REFERENCE TO THE RELATED APPLICATIONS

This application is the continuation application of International Application No. PCT/CN2021/128288, filed on Nov. 3, 2021, which is based upon and claims priority to Chinese Patent Application No. 202110366687.0, filed on Apr. 6, 2021, the entire contents of which are incorporated herein by reference.

TECHNICAL FIELD

The present invention relates to the field of phase interpolation circuits, and more particularly, to a phase interpolation circuit with a high linearity.

BACKGROUND

In a high-speed interface chip, after data is input, a clock located in a data center is required to sample the input data for subsequent data processing. The location of the data center changes with various working conditions. Thus, the phase of the sampling clock needs to be adjustable within a corresponding range. In other words, the clock requires fine phase adjustment, to obtain more timing margin for a system.

Phase Interpolation (PI) is a common technology to realize fine phase adjustment. When applied to a parallel interface such as a double data rate (DDR), the PI often cooperates with a delay-locked loop (DLL) to perform the phase interpolation on phase clocks of adjacent phases generated by the DLL, so as to obtain a multi-phase clock output with a high precision. When applied to a serial interface, the PI may be used as a part of a clock data recovery (CDR) module to perform the phase interpolation on phase clocks of adjacent phases generated by a phase-locked loop (PLL) to obtain a multi-phase clock output with a high precision. The DLL/PLL often completes rough phase adjustment, such as outputting phase clocks of 0°, 45°, 90°, 135°, 180°, 225°, 270° and 315°. In contrast, the PI completes fine phase adjustment, for example, according to the input clocks of 225° and 270°, the PI generates additional clocks of five phases between 225° and 270°, thereby improving the precision of the phase adjustment. Moreover, the principle of the phase interpolation may also be used to perform the phase adjustment on data.

Currently, a typical phase interpolation circuit is as shown in FIG. 1. IN1 and IN2 are input clocks of two phases, and PI_CELLs are basic interpolation circuits. In the FIG. 1, there are a total of 2N identical basic interpolation circuits, N is a length of the phase interpolation, which determines the number of phases to be outputted. S1 to SN and G1 to GN are all switches, which control weights of IN1 and IN2, so as to determine whether the phase outputted from the OUT is close to IN1 or IN2. Capacitors C0, C1, and C2 are used to adjust slew rates of the input signals, so that IN1 and IN2 have an overlapping clock relationship, thereby allowing a smooth output.

Linearity is an important indicator of the phase interpolation, determining the minimum adjustment precision. Due to the nonlinearity of the metal-oxide semiconductor (MOS) transistor, the phases outputted by the phase interpolation circuit shown in FIG. 1 is not in a uniform distribution. As shown in FIG. 2, D1, D2, D3, D4 are not completely equal.

In order to improve the adjustment precision, a common practice is to increase the length N of the phase interpolation to improve the linearity, but this may increase chip area and power consumption.

SUMMARY

Technical Problem

In order to improve adjustment precision of the existing phase interpolation circuit, a common practice is to increase the length N of the phase interpolation, however, which has to be taken at the cost of chip area and power consumption.

Solutions to the Problem

Technical Solution

In view of the above problem, a phase interpolation circuit with a high linearity is provided. The present invention adopts the following technical solutions:

The present invention provides a phase interpolation circuit with a high linearity, including:

a first parallel circuit constituted by M phase interpolation units, and a second parallel circuit constituted by N phase interpolation units; an input terminal of the first parallel circuit is connected to a first clock input terminal and grounded via a first capacitor; an output terminal of the first parallel circuit is connected to a clock output terminal; an input terminal of the second parallel circuit is connected to a second clock input terminal and grounded via a second capacitor; an output terminal of the second parallel circuit is connected to the clock output terminal; and the clock output terminal is grounded via a zeroth capacitor;

the clock output terminal outputs a plurality of output clock signals with different phases by controlling an on-off state of a branch where each phase interpolation unit in the first parallel circuit and the second parallel circuit is located; and a circuit parameter of each phase interpolation unit corresponds to a target output weight respectively, and the target output weight of each phase interpolation unit is determined by iteration to minimize an output delay difference of the phase interpolation circuit, where the output delay difference indicates a phase difference between all the output clock signals with different phases outputted by the phase interpolation circuit through the clock output terminal.

In a further solution, target output weights of all the phase interpolation units for minimizing the output delay difference of the phase interpolation circuit forms a target output weight combination of the phase interpolation circuit, and the phase interpolation circuit corresponds to at least two different target weight combinations.

In a further solution, an output weight of each phase interpolation unit is initialized to be equal, and an output delay difference of the phase interpolation circuit is determined; the output weight of an i-th phase interpolation unit is sequentially adjusted within a predetermined range while keeping the output weights of remaining M+N−1 phase interpolation units unchanged, to complete a traversal adjustment of the i-th phase interpolation unit, and the output delay difference of the phase interpolation circuit after each adjustment is determined; a traversal adjustment of each phase interpolation unit is sequentially performed; and the output weight of each phase interpolation unit with the minimum output delay difference of the phase interpolation circuit is used as the target output weight of each phase interpolation unit.

In a further solution, the output delay difference is determined by at least one of a variance, a standard deviation, and a typical value difference of the phase delays between the output clock signals. The typical value difference is a difference between two typical values. The typical value is any one of an extreme value, an average value, and a median value of all the phase delays.

In a further solution, a control switch is connected in series on the branch where each phase interpolation unit is located, or control switches are connected in series on branches where some of the phase interpolation units are located; and each control switch is controlled by an independent control signal, or at least two of the control switches are controlled by the same control signal.

In a further solution, M=N, each phase interpolation unit is respectively connected in series with one control switch, each branch in the first parallel circuit is in one-to-one correspondence to each branch in the second parallel circuit respectively, and two control switches on two branches having a correspondence are simultaneously controlled by a control signal and an inverted signal of the control signal and are in opposite states.

In a further solution, each phase interpolation unit includes a basic interpolation circuit and a weight adjustment circuit. The basic interpolation circuits in all the phase interpolation units are identical, and circuit parameters of the weight adjustment circuits in different phase interpolation units correspond to target output weights of the phase interpolation units.

In a further solution, the basic interpolation circuit includes a first P-channel metal-oxide semiconductor (PMOS) transistor, a second PMOS transistor, a first N-channel metal-oxide semiconductor (NMOS) transistor, and a second NMOS transistor. A source of the first PMOS transistor is connected to a power supply terminal, a drain of the first PMOS transistor is connected to a source of the second PMOS transistor, a drain of the second PMOS transistor is connected to a drain of the second NMOS transistor and is used as an output terminal of the phase interpolation unit, a source of the second NMOS transistor is connected to a drain of the first NMOS transistor, a source of the first NMOS transistor is connected to a ground terminal, a gate of the first PMOS transistor and a gate of the first NMOS transistor are both connected to an input terminal of the phase interpolation unit, a gate of the second NMOS transistor is connected to a first switching signal, and a gate of the second PMOS transistor is connected to a second switching signal, the first switching signal and the second switching signal are a pair of signals with opposite polarities; and the weight adjustment circuit is connected to the source of the second PMOS transistor and the source of the second NMOS transistor.

In a further solution, in the basic interpolation circuit, the drain of the first PMOS transistor is directly connected to the source of the second PMOS transistor, and the source of the second NMOS transistor is directly connected to the drain of the first NMOS transistor; and the weight adjustment circuit includes a third PMOS transistor and a third NMOS transistor; a source of the third PMOS transistor is connected to the power supply terminal, a drain of the third PMOS transistor is connected to a common terminal of the first PMOS transistor and the second PMOS transistor, a source of the third NMOS transistor is grounded, a drain of the third NMOS transistor is connected to a common terminal of the first NMOS transistor and the second NMOS transistor, and a gate of the third PMOS transistor and a gate of the third NMOS transistor are both connected to the input terminal of the phase interpolation unit.

In a further solution, the weight adjustment circuit includes a fourth PMOS transistor and a fourth NMOS transistor. In the basic interpolation circuit, the drain of the first PMOS transistor is connected to the source of the second PMOS transistor via the fourth PMOS transistor, and the source of the second NMOS transistor is connected to the drain of the first NMOS transistor via the fourth NMOS transistor; a source of the fourth PMOS transistor is connected to the drain of the first PMOS transistor, a drain of the fourth PMOS transistor is connected to the source of the second PMOS transistor, a gate of the fourth PMOS transistor is connected to the ground terminal, a source of the fourth NMOS transistor is connected the drain of the first NMOS transistor, a drain of the fourth NMOS transistor is connected to the source of the second NMOS transistor, and a gate of the fourth NMOS transistor is connected to the power supply terminal.

In a further solution, the phase interpolation unit is in a differential transmission mode. An input terminal of the phase interpolation unit includes a first differential input terminal and a second differential input terminal, and an output terminal of the phase interpolation unit includes a first differential output terminal and a second differential output terminal;

the basic interpolation circuit includes a fifth NMOS transistor, a sixth NMOS transistor, and a seventh NMOS transistor; a source of the fifth NMOS transistor is connected to a ground terminal, a drain of the fifth NMOS transistor is connected to a source of the sixth NMOS transistor and a source of the seventh NMOS transistor, a gate of the fifth NMOS transistor is connected to a bias voltage, a drain of the sixth NMOS transistor and a drain of the seventh NMOS transistor are connected to a power supply terminal via a load circuit, a gate of the sixth NMOS transistor is connected to the first differential input terminal, a gate of the seventh NMOS transistor is connected to the second differential input terminal, a drain of the seventh NMOS transistor is used as the first differential output terminal, and a drain of the sixth NMOS transistor is used as the second differential output terminal; and the weight adjustment circuit includes an eighth NMOS transistor and a ninth NMOS transistor; a source of the eighth NMOS transistor is connected to a source of the six NMOS transistor, a drain of the eighth NMOS transistor is connected to a drain of the six NMOS transistor, a gate of the eighth NMOS transistor is connected to the first differential input terminal, a source of the ninth NMOS transistor is connected to the source of the seventh NMOS transistor, a drain of the ninth NMOS transistor is connected to the drain of the seventh NMOS transistor, and a gate of the ninth NMOS transistor is connected to the second differential input terminal.

The Advantages of the Present Invention

Advantages

The present invention provides a phase interpolation circuit with a high linearity. The phase interpolation circuit introduces the nonlinearity by the circuit parameter of the phase interpolation unit on each phase interpolation branch, thereby compensating the nonlinearity of the MOS transistor. Designing the target output weight of each phase interpolation branch can effectively improve the linearity of the phase interpolation circuit. The present invention has a simple implementation as compared to a complex compensation technology, without increasing the length of the phase interpolation, and without sacrificing area and power consumption. In addition, the weight adjustment circuit may be embedded in the existing basic interpolation circuit to form the phase interpolation unit of the present application, which is beneficial for layout.

BRIEF DESCRIPTION OF THE DRAWINGS

Description of the Drawings

Figure 1:
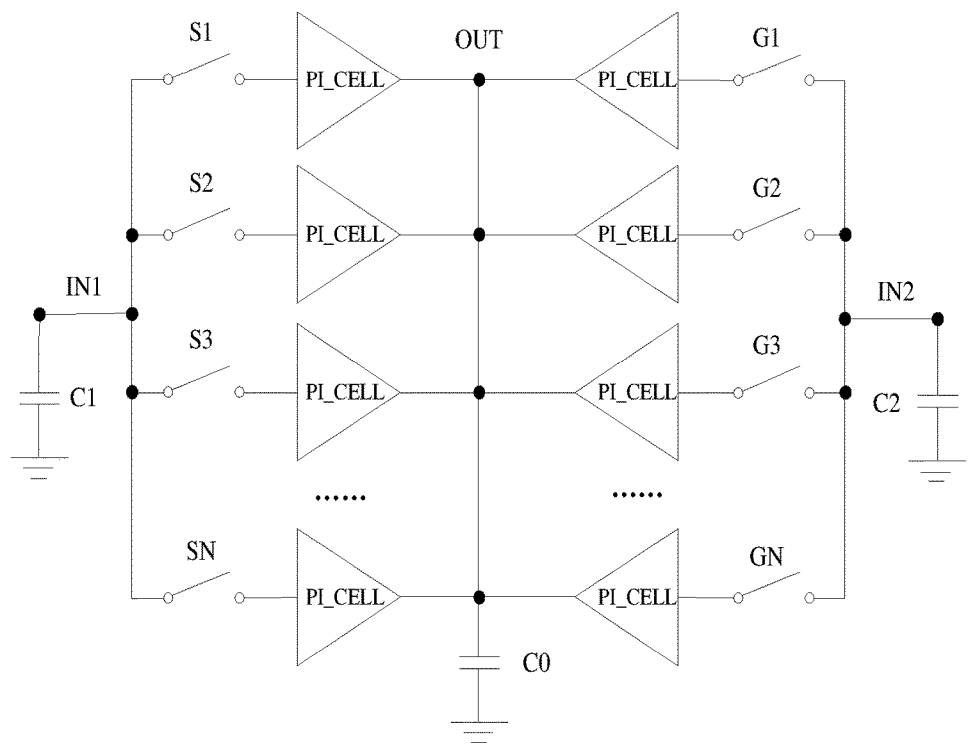

FIG. 1 is a schematic diagram showing a circuit structure of an existing phase interpolation circuit.

Figure 2:
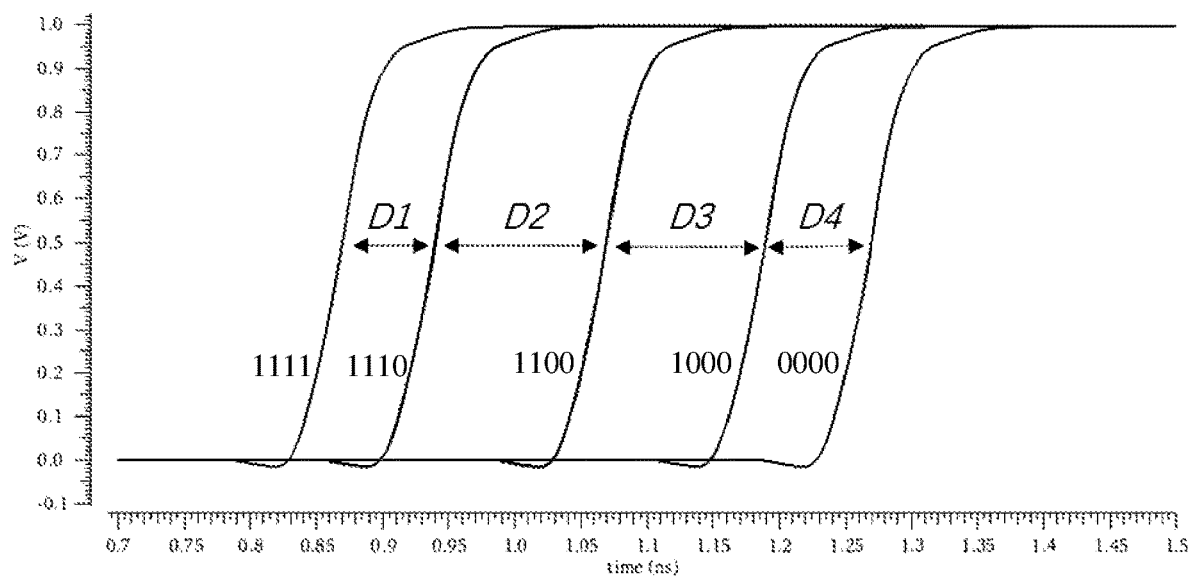

FIG. 2 is a schematic diagram showing output clock signals of the phase interpolation circuit as shown in FIG. 1.

Figure 3:
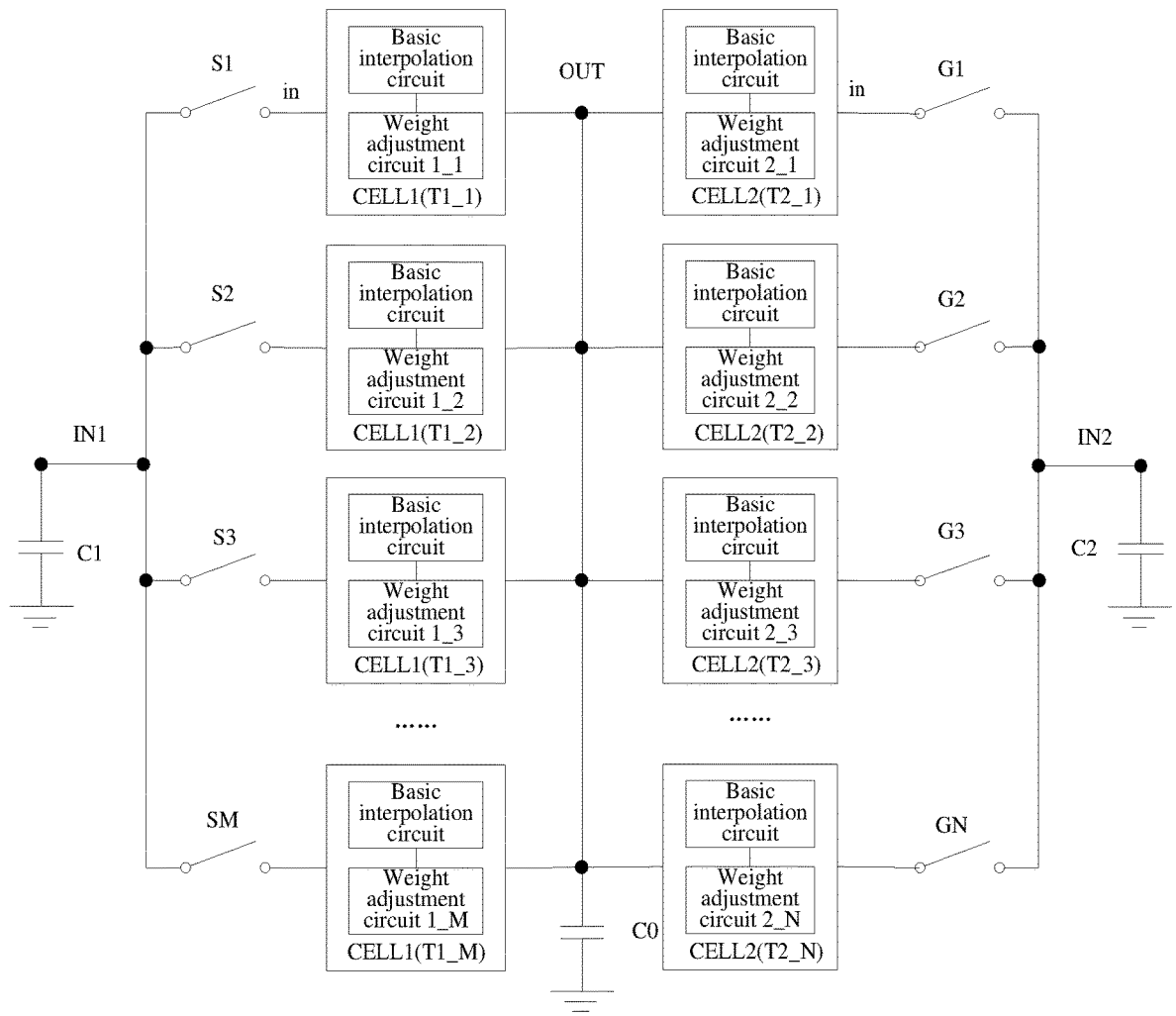

FIG. 3 is a schematic diagram showing a circuit structure of a phase interpolation circuit according to the preset disclosure.

Figure 4:
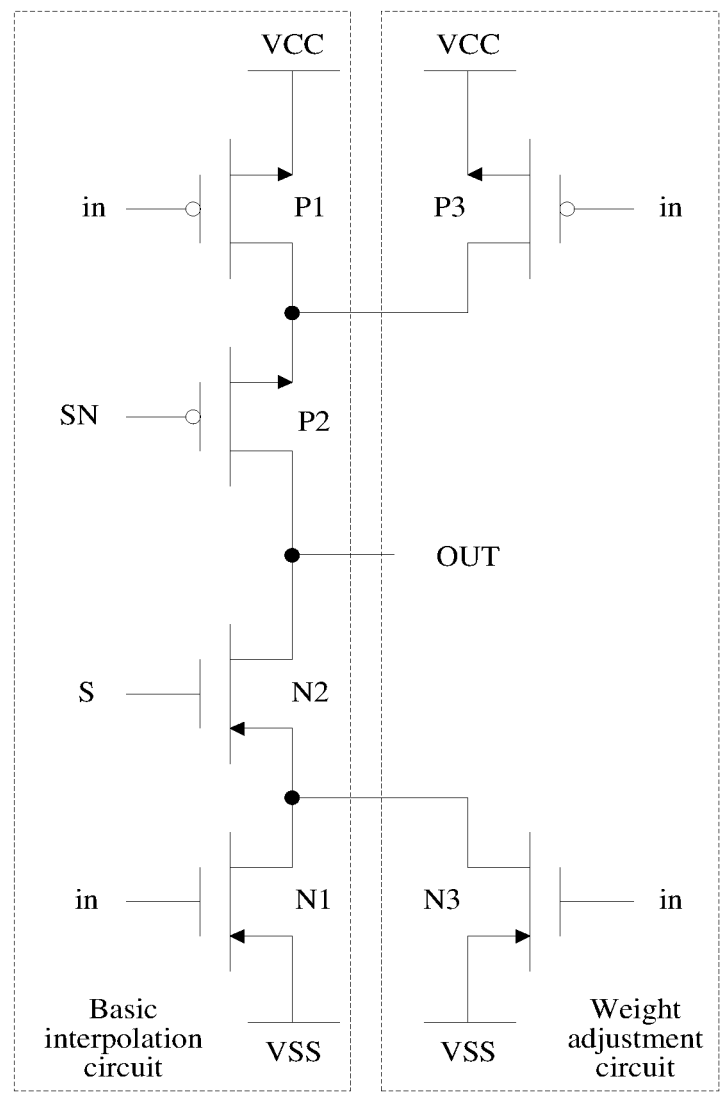

FIG. 4 is a schematic diagram showing a circuit implementation of a phase interpolation unit according to the preset disclosure.

Figure 5:
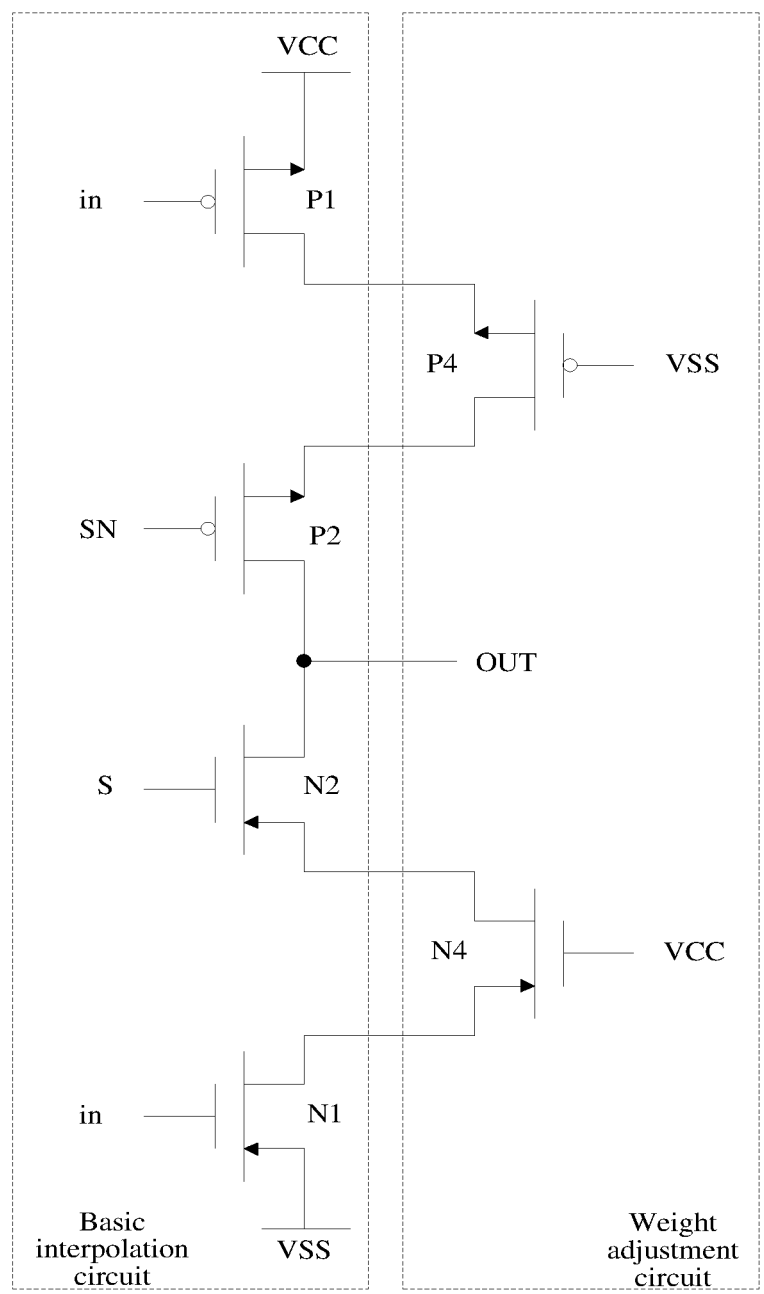

FIG. 5 is a schematic diagram showing another circuit implementation of a phase interpolation unit according to the preset disclosure.

Figure 6:
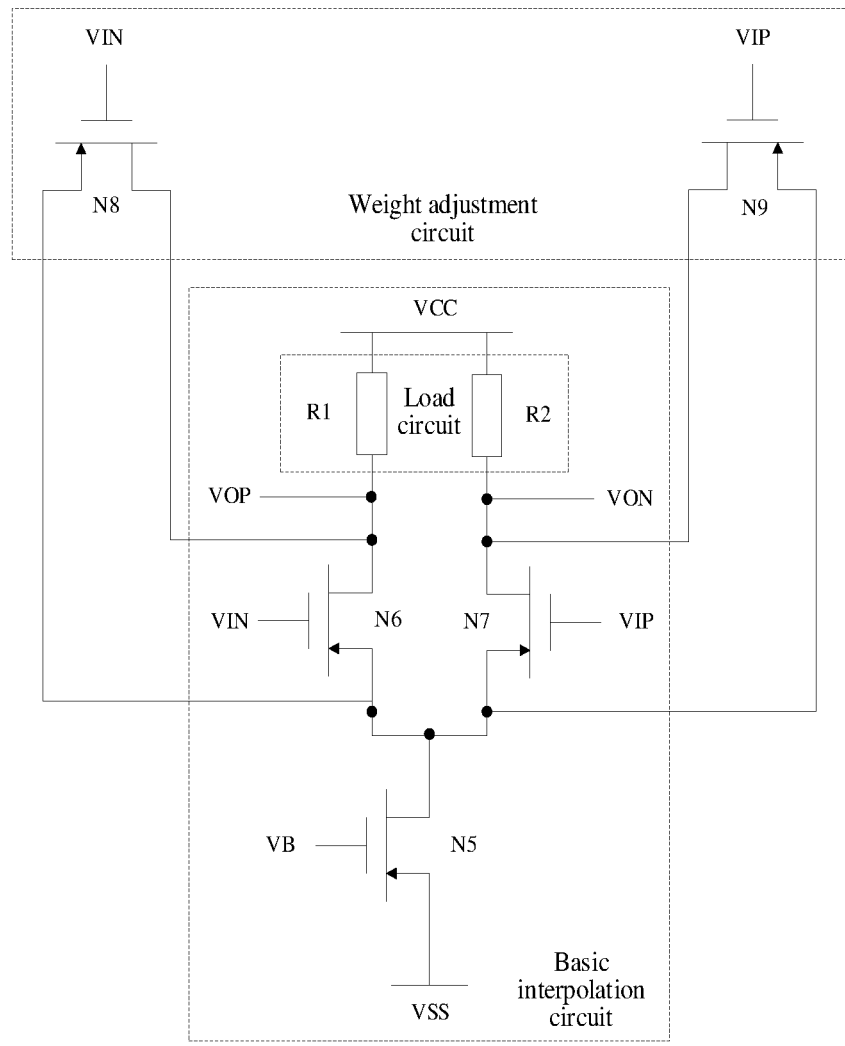

FIG. 6 is a schematic diagram showing still another circuit implementation of a phase interpolation unit according to the preset disclosure.

DETAILED DESCRIPTION OF THE EMBODIMENTS

Implementations of the Disclosure

The specific embodiments of the present invention will be further described below in conjunction with the accompanying drawings.

The present invention provides a phase interpolation circuit with a high linearity, including a first parallel circuit constituted by M phase interpolation units and a second parallel circuit constituted by N phase interpolation units. An input terminal in of each phase interpolation unit is connected to an input terminal of the parallel circuit where the phase interpolation unit is located, and an output terminal of each phase interpolation unit is connected to an output terminal of the parallel circuit where the phase interpolation unit is located. As shown in FIG. 1, the input terminal of the first parallel circuit is connected to a first clock input terminal IN1, and is grounded via a first capacitor C1. The output terminal of the first parallel circuit is connected to a clock output terminal OUT. The input terminal of the second parallel circuit is connected to a second clock input terminal IN2, and is grounded via the second capacitor C2. The output terminal of the second parallel circuit is connected to the clock output terminal OUT. The clock output terminal OUT is also grounded via a zeroth capacitor C0. The capacitors C0, C1, and C2 are configured to adjust slew rates of the input signals.

By controlling an on-off state of the branch where each phase interpolation unit in the first parallel circuit and the second parallel circuit is located, the clock output terminal OUT may output a plurality of output clock signals with different phases. For example, the on-off state of the branch is controlled by controlling an on-off state of a control switch that is connected in series with the phase interpolation unit. Optionally, a control switch is connected in series on the branch where each phase interpolation unit is located, so that the branch where each phase interpolation unit is located can be individually controlled. Alternatively, control switches are connected in series on the branches where some of the phase interpolation units are located, so that the branches having the control switches can be controlled, while the remaining branches are on by default. In addition, each control switch is respectively controlled by an independent control signal. Alternatively, at least two of the control switches are controlled by the same control signal, which includes directly using the same control signal to control a plurality of control switches, or using a control signal and an inverted signal of the control signal to control a plurality of control switches.

For the convenience of circuit control and layout design, a structure is: M=N, and each phase interpolation unit is respectively connected in series with one control switch, namely a symmetrical structure as shown in FIG. 3. Based on this symmetrical structure, each control switch may be independently controlled by its own control signal. For example, each branch in the first parallel circuit is in one-to-one correspondence to each branch in the second parallel circuit respectively. In addition, two control switches on two branches having a correspondence are simultaneously controlled by a control signal and an inverted signal of the control signal, and are accordingly in opposite states. For example, in FIG. 3, the on-off states of S1 and G1 on two branches having the correspondence are opposite, the on-off states of S2 and G2 on two branches having the correspondence are opposite, the on-off states of S3 and G3 on two branches having the correspondence are opposite, and so on, thus forming a circuit that has a symmetrical structure and is operated under a symmetrical control.

The present invention adopts the same main idea of the design, regardless of whether a symmetrical structure is used, and regardless of whether a symmetrical control manner is used. The present invention adjusts and redesigns each phase interpolation unit in the phase interpolation circuit. In the phase interpolation circuit of the present invention, a circuit parameter of each phase interpolation unit corresponds to a target output weight respectively. In FIG. 3, the target output weights corresponding to the phase interpolation units CELL1 are all T1_1, then the phase interpolation units in the FIG. 3 are represented as CELL1 (T1_1); and the target output weights corresponding to the phase interpolation units CELL2 are all T2_1, then the phase interpolation units are expressed as CELL2 (T2_1), and so on.

Different circuit parameters of the phase interpolation units may be realized by different sizes of internal components. Different phase interpolation units may have the same target output weight or different target output weights. If the symmetrical structure and the symmetrical control manner are used, the two phase interpolation units on the same link may be set to have the same target output weight, for example, T1_1 and T2_1 are identical.

The target output weight of each phase interpolation unit is determined by iteration to minimize the output delay difference. The output delay difference indicates the phase difference between output clock signals of all different phases outputted by the phase interpolation circuit through the clock output terminal OUT. Assuming that there are five output clock signals as shown in FIG. 2, the output delay difference represents a difference between D1, D2, D3, and D4. A smaller output delay difference indicates a higher linearity of the phase interpolation circuit.

In the existing phase interpolation unit, all the basic interpolation circuits PI_CELLs are identical. That is, all the PI_CELLs in the existing circuit as shown in FIG. 1 have the same output weight. Due to the nonlinearity of the MOS transistor, it can be seen from FIG. 2 that D1 and D4 are smaller, and D2 and D3 are larger, resulting in a lower linearity of the phase interpolation circuit. The present invention has the following considerations.

The states of S1 to S4 are indicated by 1 and 0, 1 indicating that a switch is on, and 0 indicating that a switch is off. Thus, 1111 indicates that S4 to S1 are all on, 1110 indicates that S4 to S2 are all on, and S1 is off, and so on. In addition, each state of G4 to G1 is opposite with the corresponding one of S4 to S1. In FIG. 1, assuming that the weights of two PI_CELLs on the same link are equal, IN1(1111) is defined to indicate that there are four basic interpolation circuits whose weights are T1, T2, T3, and T4 respectively, making the output clock signal to trend to IN1; and IN2(0000) is defined to indicate that there are basic interpolation circuits whose weights are not T1, T2, T3, and T4, making the output clock signal to tend to IN2. Thus, in FIG. 2, the leftmost output clock signal tending to IN1 may be expressed as IN1(1111)+IN2(0000), the next output clock signal may be expressed as IN1(1110)+IN2(0001), and so on. In FIG. 1, T1=T2=T3=T4. Since IN2(0001) in IN1(1110)+IN2(0001) is too weak, D1 is small. In this case, T1 may be increased, to increase D1. Similarly, in a case that D2 is too large, T2 may be decreased, namely weakening IN2(0011). However, changing a parameter, such as T1, will increase D1, and at the same time, impact D2, D3, and D4. Therefore, the present invention determines each target output weight through iteration.

A process of determining the target output weight corresponding to each phase interpolation unit is as follows.

An output weight of each phase interpolation unit is initialized to be equal, and an output delay difference of the phase interpolation circuit is determined. The output weight of an i-th phase interpolation unit is adjusted within a predetermined range while keeping the output weights of remaining M+N−1 phase interpolation units unchanged, so as to complete a traversal adjustment of the i-th phase interpolation unit, and the output delay difference of the phase interpolation circuit after each adjustment is determined. In this way, the traversal adjustment of each phase interpolation unit is performed sequentially. The output weight of each phase interpolation unit with the minimum output delay difference of the phase interpolation circuit is used as the target output weight of each phase interpolation unit.

The predetermined range of the output weight of each phase interpolation unit during adjustment is usually determined by a range of a circuit parameter that is realizable by the circuit structure, and thus may be considered as a predetermined one. During the above process, each time any phase interpolation unit may be selected for the adjustment of the output weight. A different adjustment order may lead to a different final target output weight of each phase interpolation unit. Thus, in the present invention, if the target output weights of all the phase interpolation units for minimizing the output delay difference are defined to form a target output weight combination, the phase interpolation circuit corresponds to at least two different target weight combinations. An optimal target weight combination may be selected for actual application. The optimal target weight combination may be the one that has an optimal circuit performance, for example, the total circuit parameters of all corresponding phase interpolation units are minimum.

In the present invention, the output delay difference may be measured in a variety of ways, including but not limited to, calculating a variance, a standard deviation, and a typical value difference of all the phase delays between the output clock signals. The typical value difference is a difference between two typical values, and the typical value is any one of an extreme value, an average value, and a median value of all the phase delays.

In the present invention, the output delay difference is measured by the typical value difference determined by the extreme value and the average value AVE of all the phase delays. The extreme value includes the maximum value MAX of all the phase delays and the minimum value of N phase delays. The output delay difference is:

$$\text{Target}=\max((\text{max}-\text{ave}),(\text{ave}-\text{min}));$$

That is, the output delay difference is the maximum of a difference between the maximum value and the average value, and a difference between the minimum value and the average value.

In the present invention, each phase interpolation unit respectively includes a basic interpolation circuit and a weight adjustment circuit. The basic interpolation circuits in all the phase interpolation units are identical, and the circuit parameters of the weight adjustment circuits in different phase interpolation units correspond to the output weights of the phase interpolation units where they are located. The basic interpolation circuit may have the circuit structure of the existing basic interpolation circuit PI_CELL as shown in FIG. 1. That is, the phase interpolation unit in the present invention may be considered as an improvement by adding the weight adjustment circuit on the basis of the existing PI_CELL circuit. Thus, the existing PI_CELL circuit can be directly used. In addition, each phase interpolation unit may use the same PI_CELL circuit, and based on which, additionally combine the weight adjustment circuit with a different circuit parameter, thereby reducing the difficulty of circuit design.

The phase interpolation unit in the present invention has various circuit implementations, mainly including two types:

In a first type, the phase interpolation unit is in a single-ended transmission mode. As shown in FIG. 4 and FIG. 5, the basic interpolation circuit includes a first P-channel metal-oxide semiconductor (PMOS) transistor P1, a second PMOS transistor P2, a first N-channel metal-oxide semiconductor (NMOS) transistor N1, and a second NMOS transistor N2. A source of the first PMOS transistor P1 is connected to a power supply terminal VCC. A drain of the first PMOS transistor P1 is connected to a source of the second PMOS transistor P2. A drain of the second PMOS transistor P2 is connected to a drain of the second NMOS transistor N2, and is used as the output terminal of the phase interpolation unit, namely the clock output terminal OUT. A source of the second NMOS transistor N2 is connected to a drain of the first NMOS transistor N1. A source of the first NMOS transistor N1 is connected to a ground terminal VSS. A gate of the first PMOS transistor P1 and a gate of the first NMOS transistor N1 are both connected to the input terminal in of the phase interpolation unit. A gate of the second NMOS transistor N2 is connected to a first switching signal, and a gate of the second PMOS transistor P2 is connected to a second switching signal. The first switching signal and the second switching signal are a pair of signals with opposite polarities. The weight adjustment circuit is connected to the source of the second PMOS transistor P2 and the source of the second NMOS transistor N2.

Based on this architecture, two specific circuit structures are as follows:

(1) As shown in FIG. 4, in the basic interpolation circuit, the drain of the first PMOS transistor P1 is directly connected to the source of the second PMOS transistor P2, and the source of the second NMOS transistor N2 is directly connected to the drain of the first NMOS transistor N1.

The weight adjustment circuit includes a third PMOS transistor P3 and a third NMOS transistor N3. A source of the third PMOS transistor P3 is connected to the power supply terminal VCC, and a drain of the third PMOS transistor P3 is connected to a common terminal of the first PMOS transistor P1 and the second PMOS transistor P2. A source of the third NMOS transistor N3 is grounded, and a drain of the third NMOS transistor N3 is connected to a common terminal of the first NMOS transistor N1 and the second NMOS transistor N2. A gate of the third PMOS transistor P3 and a gate of the third NMOS transistor N3 are both connected to the input terminal in of the phase interpolation unit. Thus, the sizes of the P3 and N3 correspond to the target output weight of the phase interpolation unit where they are located.

(2) As shown in FIG. 5, the weight adjustment circuit includes a fourth PMOS transistor P4 and a fourth NMOS transistor N4. In the basic interpolation circuit, the drain of the first PMOS transistor P1 is connected to the source of the second PMOS transistor P2 via the fourth PMOS transistor P4, and the source of the second NMOS transistor N2 is connected to the drain of the first NMOS transistor N1 via the fourth NMOS transistor N4. A source of the fourth PMOS transistor P4 is connected to the drain of the first PMOS transistor P1, a drain of the fourth PMOS transistor P4 is connected to the source of the second PMOS transistor P2, and a gate of the fourth PMOS transistor P4 is connected to the ground terminal VSS. A source of the fourth NMOS transistor N4 is connected the drain of the first NMOS transistor N1, a drain of the fourth NMOS transistor N4 is connected to the source of the second NMOS transistor N2, and a gate of the fourth NMOS transistor N4 is connected to the power supply terminal VCC. Thus, the sizes of the P4 and N4 correspond to the target output weight of the phase interpolation unit where they are located.

In a second type, the phase interpolation unit is in a differential transmission mode. As shown in FIG. 6, the input terminal of the phase interpolation unit includes a first differential input terminal VIN and a second differential input terminal VIP, and the output terminal of the phase interpolation unit includes a first differential output terminal VON and a second differential output terminal VOP.

The basic interpolation circuit includes a fifth NMOS transistor N5, a sixth NMOS transistor N6, and a seventh NMOS transistor N7. A source of the fifth NMOS transistor N5 is connected to the ground terminal VSS, a drain of the fifth NMOS transistor N5 is connected to a source of the sixth NMOS transistor N6 and a source of the seventh NMOS transistor N7, and a gate of the fifth NMOS transistor N5 is connected to a bias voltage VB. A drain of the sixth NMOS transistor N6 and a drain of the seventh NMOS transistor N7 are connected to the power supply terminal VCC via a load circuit. The load circuit is set as required, for example, as shown in FIG. 6, it may be implemented by resistors R1 and R2 connecting the N6 and N7. A gate of the sixth NMOS transistor N6 is connected to the first differential input terminal VIN. A gate of the seventh NMOS transistor N7 is connected to the second differential input terminal VIP. A drain of the seventh NMOS transistor N7 is used as the first differential output terminal VON. A drain of the sixth NMOS transistor N6 is used as the second differential output terminal VOP.

The weight adjustment circuit includes an eighth NMOS transistor N8 and a ninth NMOS transistor N9. A source of the eighth NMOS transistor N8 is connected to the source of the six NMOS transistor N2, a drain of the eighth NMOS transistor N8 is connected to the drain of the six NMOS transistor N2, and a gate of the eighth NMOS transistor N8 is connected to the first differential input terminal VIN. A source of the ninth NMOS transistor N9 is connected to the source of the seventh NMOS transistor N7, a drain of the ninth NMOS transistor N9 is connected to the drain of the seventh NMOS transistor N7, and a gate of the ninth NMOS transistor N9 is connected to the second differential input terminal VIP. Thus, the sizes of N8 and N9 correspond to the target output weight of the phase interpolation unit where they are located.

The above embodiment is merely intended to describe the preferred embodiments of the present invention rather than to limit the scope of the present invention. Various alterations and improvements made by those of ordinary skill in the art based on the technical solution of the present invention without departing from the design spirit of the present invention shall fall within the protection scope of the claims of the present invention.

What is claimed is:

1. A phase interpolation circuit with a high linearity, comprising:
 a first parallel circuit constituted by M phase interpolation units, and
 a second parallel circuit constituted by N phase interpolation units;
 wherein an input terminal of the first parallel circuit is connected to a first clock input terminal and the input terminal of the first parallel circuit is grounded via a first capacitor;
 an output terminal of the first parallel circuit is connected to a clock output terminal;
 an input terminal of the second parallel circuit is connected to a second clock input terminal and the input terminal of the second parallel circuit is grounded via a second capacitor;
 an output terminal of the second parallel circuit is connected to the clock output terminal;
 the clock output terminal is grounded via a zeroth capacitor;
 the clock output terminal outputs a plurality of output clock signals with different phases by controlling an on-off state of a branch, wherein each phase interpolation unit in the first parallel circuit and the second parallel circuit is located at the branch; and
 a circuit parameter of each phase interpolation unit corresponds to a target output weight respectively, and the target output weight of each phase interpolation unit is determined by iteration to minimize an output delay difference of the phase interpolation circuit, wherein the output delay difference indicates a phase difference between the plurality of output clock signals with different phases outputted by the phase interpolation circuit through the clock output terminal.

2. The phase interpolation circuit according to claim 1, wherein
 target output weights of the M phase interpolation units and the N phase interpolation units for minimizing the output delay difference of the phase interpolation circuit forms a target output weight combination of the phase interpolation circuit, and the phase interpolation circuit corresponds to at least two different target weight combinations.

3. The phase interpolation circuit according to claim 1, wherein
an output weight of each phase interpolation unit is initialized to be equal, and an output delay difference of the phase interpolation circuit is determined;
the output weight of an i-th phase interpolation unit is sequentially adjusted within a predetermined range while keeping output weights of remaining M+N−1 phase interpolation units unchanged, to complete a traversal adjustment of the i-th phase interpolation unit, and the output delay difference of the phase interpolation circuit after each adjustment is determined;
a traversal adjustment of each phase interpolation unit is sequentially performed; and
the output weight of each phase interpolation unit with a minimum output delay difference of the phase interpolation circuit is used as the target output weight of each phase interpolation unit.

4. The phase interpolation circuit according to claim 1, wherein
a control switch is connected in series on the branch, wherein each phase interpolation unit is located at the branch, or control switches are connected in series on branches, wherein some of the M phase interpolation units and the N phase interpolation units are located at the branches; and
the control switch is controlled by an independent control signal, or at least two of the control switches are controlled by a same control signal.

5. The phase interpolation circuit according to claim 4, wherein
M=N, each phase interpolation unit is respectively connected in series with one control switch, each branch in the first parallel circuit is in one-to-one correspondence to each branch in the second parallel circuit respectively; and
two control switches on two branches having a correspondence are simultaneously controlled by a control signal and an inverted signal of the control signal and the two control switches are in opposite states.

6. The phase interpolation circuit according to claim 1, wherein
each phase interpolation unit comprises a basic interpolation circuit and a weight adjustment circuit; wherein basic interpolation circuits in the M phase interpolation units and the N phase interpolation units are identical, and circuit parameters of weight adjustment circuits in different phase interpolation units correspond to target output weights of the different phase interpolation units.

7. The phase interpolation circuit according to claim 6, wherein
the basic interpolation circuit comprises a first P-channel metal-oxide semiconductor (PMOS) transistor, a second PMOS transistor, a first N-channel metal-oxide semiconductor (NMOS) transistor, and a second NMOS transistor; wherein
a source of the first PMOS transistor is connected to a power supply terminal,
a drain of the first PMOS transistor is connected to a source of the second PMOS transistor,
a drain of the second PMOS transistor is connected to a drain of the second NMOS transistor and the drain of the second PMOS transistor is used as an output terminal of the phase interpolation unit,
a source of the second NMOS transistor is connected to a drain of the first NMOS transistor,
a source of the first NMOS transistor is connected to a ground terminal,
a gate of the first PMOS transistor and a gate of the first NMOS transistor are connected to an input terminal of the phase interpolation unit,
a gate of the second NMOS transistor is connected to a first switching signal,
a gate of the second PMOS transistor is connected to a second switching signal,
the first switching signal and the second switching signal are a pair of signals with opposite polarities, and
the weight adjustment circuit is connected to the source of the second PMOS transistor and the source of the second NMOS transistor.

8. The phase interpolation circuit according to claim 7, wherein
in the basic interpolation circuit, the drain of the first PMOS transistor is directly connected to the source of the second PMOS transistor, and the source of the second NMOS transistor is directly connected to the drain of the first NMOS transistor; and
the weight adjustment circuit comprises a third PMOS transistor and a third NMOS transistor; wherein
a source of the third PMOS transistor is connected to the power supply terminal,
a drain of the third PMOS transistor is connected to a common terminal of the first PMOS transistor and the second PMOS transistor,
a source of the third NMOS transistor is grounded,
a drain of the third NMOS transistor is connected to a common terminal of the first NMOS transistor and the second NMOS transistor, and
a gate of the third PMOS transistor and a gate of the third NMOS transistor are connected to the input terminal of the phase interpolation unit.

9. The phase interpolation circuit according to claim 7, wherein
the weight adjustment circuit comprises a fourth PMOS transistor and a fourth NMOS transistor; wherein
in the basic interpolation circuit, the drain of the first PMOS transistor is connected to the source of the second PMOS transistor via the fourth PMOS transistor, and the source of the second NMOS transistor is connected to the drain of the first NMOS transistor via the fourth NMOS transistor;
a source of the fourth PMOS transistor is connected to the drain of the first PMOS transistor,
a drain of the fourth PMOS transistor is connected to the source of the second PMOS transistor,
a gate of the fourth PMOS transistor is connected to the ground terminal,
a source of the fourth NMOS transistor is connected the drain of the first NMOS transistor,
a drain of the fourth NMOS transistor is connected to the source of the second NMOS transistor, and
a gate of the fourth NMOS transistor is connected to the power supply terminal.

10. The phase interpolation circuit according to claim 6, wherein
the phase interpolation unit is in a differential transmission mode, wherein an input terminal of the phase interpolation unit comprises a first differential input terminal and a second differential input terminal, and an output terminal of the phase interpolation unit comprises a first differential output terminal and a second differential output terminal;

the basic interpolation circuit comprises a fifth NMOS transistor, a sixth NMOS transistor, and a seventh NMOS transistor; wherein
- a source of the fifth NMOS transistor is connected to a ground terminal,
- a drain of the fifth NMOS transistor is connected to a source of the sixth NMOS transistor and a source of the seventh NMOS transistor,
- a gate of the fifth NMOS transistor is connected to a bias voltage,
- a drain of the sixth NMOS transistor and a drain of the seventh NMOS transistor are connected to a power supply terminal via a load circuit,
- a gate of the sixth NMOS transistor is connected to the first differential input terminal,
- a gate of the seventh NMOS transistor is connected to the second differential input terminal,
- a drain of the seventh NMOS transistor is used as the first differential output terminal, and
- a drain of the sixth NMOS transistor is used as the second differential output terminal; and the weight adjustment circuit comprises an eighth NMOS transistor and a ninth NMOS transistor; wherein
- a source of the eighth NMOS transistor is connected to the source of the six NMOS transistor,
- a drain of the eighth NMOS transistor is connected to the drain of the six NMOS transistor,
- a gate of the eighth NMOS transistor is connected to the first differential input terminal,
- a source of the ninth NMOS transistor is connected to the source of the seventh NMOS transistor,
- a drain of the ninth NMOS transistor is connected to the drain of the seventh NMOS transistor, and
- a gate of the ninth NMOS transistor is connected to the second differential input terminal.

* * * * *